(12) United States Patent
Kang et al.

(10) Patent No.: US 10,930,680 B2
(45) Date of Patent: Feb. 23, 2021

(54) DISPLAY APPARATUS

(71) Applicant: Samsung Display Co., Ltd., Yongin-si (KR)

(72) Inventors: Jaewook Kang, Yongin-si (KR); Daewoo Lee, Yongin-si (KR); Takyoung Lee, Yongin-si (KR)

(73) Assignee: Samsung Disploy Co., Ltd., Yongin-si (KR)

( * ) Notice: Subject to any disclaimer, the term of this patent is extended or adjusted under 35 U.S.C. 154(b) by 0 days.

(21) Appl. No.: 16/248,446

(22) Filed: Jan. 15, 2019

(65) Prior Publication Data

US 2019/0221584 A1    Jul. 18, 2019

(30) Foreign Application Priority Data

Jan. 16, 2018    (KR) .......................... 10-2018-0005746

(51) Int. Cl.
*H01L 27/14*     (2006.01)
*H01L 27/12*     (2006.01)
*H01L 29/786*    (2006.01)

(52) U.S. Cl.
CPC ........ *H01L 27/124* (2013.01); *H01L 27/1255* (2013.01); *H01L 29/78645* (2013.01)

(58) Field of Classification Search
CPC .............. H01L 27/124; H01L 27/1255; H01L 29/78645
USPC .............................................. 257/43, 59, 72
See application file for complete search history.

(56) References Cited

U.S. PATENT DOCUMENTS

| | | | |
|---|---|---|---|
| 7,049,215 B2 * | 5/2006 | Lai | G02F 1/13458 257/E21.414 |
| 8,227,803 B2 | 7/2012 | Park | |
| 8,637,894 B2 * | 1/2014 | Lee | H01L 27/3276 257/99 |
| 2012/0074408 A1 * | 3/2012 | Moon | H01L 27/3262 257/57 |
| 2015/0077953 A1 | 3/2015 | Namkung et al. | |
| 2017/0186803 A1 * | 6/2017 | Shimotsusa | H01L 24/80 |
| 2018/0139312 A1 * | 5/2018 | Yamazaki | H04B 1/3888 |

FOREIGN PATENT DOCUMENTS

| | | |
|---|---|---|
| KR | 10-2011-0065717 | 6/2011 |
| KR | 10-2011-0067404 | 6/2011 |
| KR | 10-2011-0078789 | 7/2011 |

* cited by examiner

*Primary Examiner* — Tan N Tran
(74) *Attorney, Agent, or Firm* — H.C. Park & Associates, PLC

(57) ABSTRACT

A display apparatus includes a substrate, a display unit, a pad portion, and a connection wire. The display unit is on the substrate. The display unit includes a pixel circuit and a display device electrically connected to the pixel circuit. The pad portion is at one side of a peripheral area outside the display unit. The pad portion includes a first conductive layer, a second conductive layer arranged on and electrically connected to the first conductive layer, and a third conductive layer arranged on and electrically connected to the second conductive layer. The connection wire connects the pad portion and the display unit to each other to transmit a signal input to the pad portion to the display device. The connection wire includes a same material as that of the first conductive layer.

18 Claims, 7 Drawing Sheets

DISPLAY APPARATUS

CROSS-REFERENCE TO RELATED APPLICATION

This application claims priority from and the benefit of Korean Patent Application No. 10-2018-0005746, filed Jan. 16, 2018, which is hereby incorporated by reference for all purposes as if fully set forth herein.

BACKGROUND

Field

One or more exemplary embodiments relate to a display apparatus, and more particularly, to a display apparatus including a pad connection portion with improved reliability.

Discussion

Among display apparatuses, organic light-emitting display apparatuses have received attention because of their wide viewing angles, high contrast ratios, and fast response times. In general, an organic light-emitting display apparatus includes a thin-film transistor (TFT) and an organic light-emitting device formed on a substrate. The organic light-emitting device is self-emissive, or in other words, emits light itself. Such an organic light-emitting display apparatus may be used as a display for a small product, such as a mobile phone, or may be used as a display for a large product, such as a television. In such an organic light-emitting display apparatus, a display area where an image is displayed and a peripheral area outside the display area are set, and the peripheral area may include a pad area where pads are formed.

The above information disclosed in this section is only for understanding the background of the inventive concepts, and, therefore, may contain information that does not form prior art.

SUMMARY

As resolution increases in a conventional display apparatus, a thickness of an inorganic film in a pad area gradually decreases, and thus, the inorganic film may generate crack-related defects, which cause short circuits and/or driving defects of pads and wires connected thereto. Accordingly, one or more exemplary embodiments include a display apparatus in which a pad connection portion has improved reliability.

Additional aspects will be set forth in part in the description which follows and, in part, will be apparent from the description, or may be learned by practice of the presented embodiments.

According to one or more exemplary embodiments, a display apparatus includes a substrate, a display unit, a pad portion, and a connection wire. The display unit is on the substrate. The display unit includes a pixel circuit and a display device electrically connected to the pixel circuit. The pad portion is at one side of a peripheral area outside the display unit. The pad portion includes a first conductive layer, a second conductive layer arranged on and electrically connected to the first conductive layer, and a third conductive layer arranged on and electrically connected to the second conductive layer. The connection wire connects the pad portion and the display unit to each other to transmit a signal input to the pad portion to the display device. The connection wire includes a same material as that of the first conductive layer.

In some exemplary embodiments, the connection wire may be configured to transmit a data signal input to the pad portion to the display device.

In some exemplary embodiments, the pixel circuit may include a thin film transistor, a first wiring layer, and a second wiring layer. The thin film transistor may include a semiconductor layer, and a first gate electrode at least partially overlapping the semiconductor layer. The first gate electrode may be between the first wiring layer and the substrate. The first wiring layer may be between the second wiring layer and the first gate electrode.

In some exemplary embodiments, the first conductive layer may include a same material as that of the first gate electrode.

In some exemplary embodiments, the second conductive layer may include a same material as that of the first wiring layer.

In some exemplary embodiments, the third conductive layer may include a same material as that of the second wiring layer.

In some exemplary embodiments, the display apparatus may further include a first insulating layer between the first conductive layer and the second conductive layer. The first insulating layer may include a first contact hole. The first conductive layer and the second conductive layer may be in contact with one another via the first contact hole.

In some exemplary embodiments, on a plane, an area of the first contact hole may be 10% to 30% of that of the third conductive layer.

In some exemplary embodiments, the display apparatus may further include a second insulating layer between the second conductive layer and the third conductive layer. The second insulating layer may include a second contact hole. The second conductive layer and the third conductive layer may be in contact with one another via the second contact hole.

In some exemplary embodiments, on a plane, an area of the second contact hole may be 70% to 90% of that of the third conductive layer.

In some exemplary embodiments, on a plane, an area of the first contact hole may be one fourth of that of the second contact hole.

In some exemplary embodiments, the pixel circuit may further include a second gate electrode between the first gate electrode and the first wiring layer, and the first conductive layer may include a same material as that of the second gate electrode.

In some exemplary embodiments, the display apparatus may further include a printed circuit board electrically connected to the pad portion.

According to one or more embodiments, a display apparatus includes a substrate, a display unit, a connection wire, and a pad portion. The substrate includes a display area and a peripheral area outside the display area. The display unit is on the display area of the substrate. The display unit includes a pixel circuit and a display device electrically connected to the pixel circuit. The pixel circuit includes: a thin film transistor including a semiconductor layer and a gate electrode; a first wiring layer, the gate electrode being between the first wiring layer and the substrate; and a second wiring layer, the first wiring layer being between the second wiring layer and the gate electrode. The connection wire is electrically connected to the pixel circuit and extends towards the peripheral area. The pad portion is at one side of the peripheral area of the substrate. The pad portion is configured to transmit a signal to the display device via the connection wire. The pad portion includes: a first conductive layer including a same material as that of the gate electrode; a second conductive layer at least partially overlapping the first conductive layer, the second conductive layer including a same material as that of the first wiring layer; and a third conductive layer exposed to the outside and at least partially overlapping the second conductive layer, the third conductive layer including a same material as that of the second wiring layer.

In some exemplary embodiments, the connection wire may include a same material as that of the gate electrode.

In some exemplary embodiments, the display apparatus may further include a first insulating layer and a second insulating layer. The first insulating layer may be between the first conductive layer and the second conductive layer. The first insulating layer may include at least one first contact hole. The first conductive layer and the second conductive layer may be in contact with one another via the first contact hole. The second insulating layer may be between the second conductive layer and the third conductive layer. The second insulating layer may include at least one second contact hole. The second conductive layer and the third conductive layer may be in contact with one another via the second contact hole.

In some exemplary embodiments, the first contact hole and the second contact hole may not overlap each other on a plane.

In some exemplary embodiments, on a plane, an area of the first contact hole may be one fourth of that of the second contact hole.

In some exemplary embodiments, the connection wire may be configured to transmit a data signal input to the pad portion to the display device.

In some exemplary embodiments, the display apparatus may further include a printed circuit board contacting the third conductive layer and electrically connected to the pad portion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
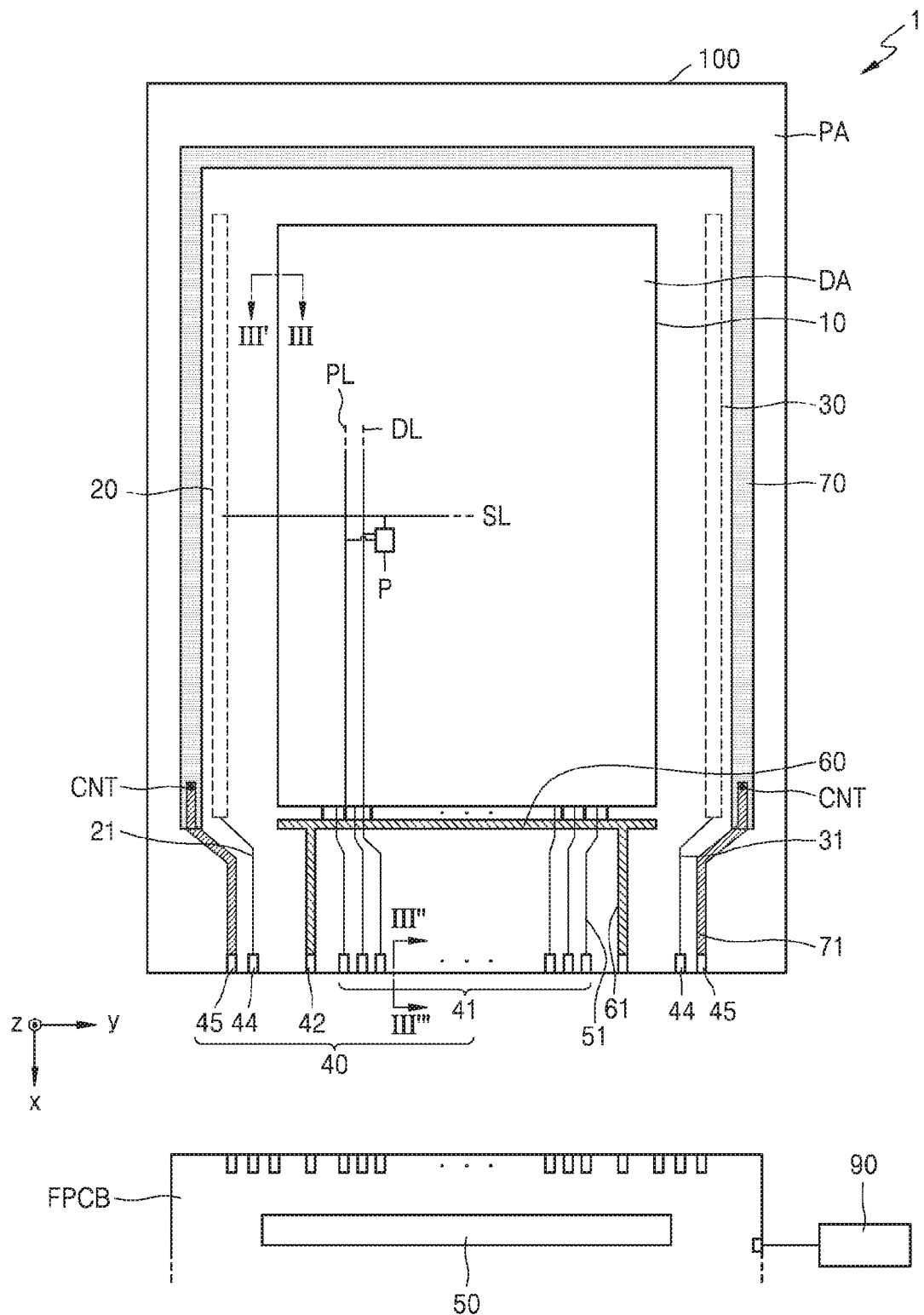
FIG. 1 is a schematic plan view of a display apparatus according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. Further, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

According to various exemplary embodiments, a display apparatus is an apparatus for displaying an image, and may be a liquid crystal display apparatus, an electrophoretic display apparatus, an organic light-emitting display apparatus, an inorganic light-emitting display apparatus, a field emission display apparatus, a surface-conduction electron-emitter display apparatus, a plasma display apparatus, a cathode ray display apparatus, etc.

Hereinafter, as a display apparatus according to some exemplary embodiments, an organic light-emitting display apparatus will be described as an example; however, exemplary embodiments are not limited thereto, and may be various types of display apparatuses.

Figure 2:
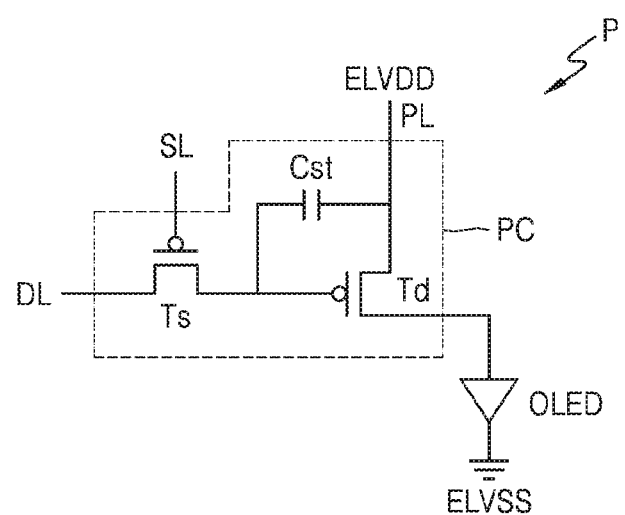
FIG. 2 is an equivalent circuit diagram of a pixel of a display apparatus according to some exemplary embodiments.

FIG. 1 is a schematic plan view of a display apparatus according to some exemplary embodiments. FIG. 2 is an equivalent circuit diagram of a pixel of a display apparatus according to some exemplary embodiments.

Referring to FIG. 1, the display apparatus 1 includes a display unit 10 on a substrate 100. The display unit 10 includes pixels P connected to a scan line SL extending in direction Y and a data line DL extending in direction X crossing the direction Y. The display unit 10 provides a determined image through light emitted from the pixels P and defines a display area DA.

Each pixel P may emit, for example, red light, green light, blue light, or white light; however, exemplary embodiments are not limited thereto. For instance, any suitable color of light may be emitted by one or more of the pixels P. Each pixel P includes a display device, and the display device may include an organic light-emitting diode. A pixel P described herein refers to a pixel that emits light of which the color is one of red, green, blue, and white as described above.

Referring to FIG. 2, the pixel P may include a pixel circuit PC connected to the scan line SL and the data line DL, and an organic light-emitting diode OLED connected to the pixel circuit PC. The pixel circuit PC includes a driving thin film transistor Td, a switching thin film transistor Ts, and a storage capacitor Cst. The switching thin film transistor Ts is connected to the scan line SL and the data line DL, and transmits a data signal input via the data line DL to the driving thin film transistor Td according to a scan signal input via the scan line SL.

The storage capacitor Cst is connected to the switching thin film transistor Ts and a driving voltage line PL, and stores a voltage corresponding to a voltage received from the switching thin film transistor Ts and a driving voltage ELVDD supplied to the driving voltage line PL.

The driving thin film transistor Td is connected to the driving voltage line PL and the storage capacitor Cst, and may control driving current flowing through the organic light-emitting diode OLED from the driving voltage line PL in response to a voltage value stored in the storage capacitor Cst. Due to the driving current, the organic light-emitting diode OLED may emit light having determined brightness. The organic light-emitting diode OLED may emit, for example, red light, green light, blue light, or white light.

Although a case in which the pixel P includes two thin film transistors and one storage capacitor has been described with reference to FIG. 2, the inventive concepts are not limited thereto. In some exemplary embodiments, the pixel circuit PC of the pixel P may be variously modified, for example, to include three or more thin film transistors or include two or more storage capacitors.

Referring to FIG. 1 again, a peripheral area PA is outside of the display area DA. For example, the peripheral area PA may surround the display area DA. The peripheral area PA, which is an area where the pixels P are not arranged, corresponds to a non-display area that provides no image.

A drive circuit, for example, first and second scan drive circuits 20 and 30, a pad portion 40, a driving power supply wire 60, and a common power supply wire 70 may be arranged in the peripheral area PA.

The first and second scan drive circuits 20 and 30 are arranged on the peripheral area PA of the substrate 100, and generate and transmit a scan signal to each pixel P via the scan line SL. For example, although the first scan drive circuit 20 may be on a left side of the display unit 10, and the second scan drive circuit 30 may be on a right side of the display unit 10, the inventive concepts are not limited thereto. In some exemplary embodiments, only one scan drive circuit may be provided, or more than two scan drive circuits may be provided.

The pad portion 40 is arranged on one end portion of the substrate 100, and includes a plurality of pads 41, 42, 44, and 45. The pad portion 40 may not be covered by an insulating layer and be exposed, and thus, may be electrically connected to a flexible printed circuit board FPCB. The pad portion 40 may be on one side of the substrate 100 where the first and second scan drive circuits 20 and 30 are not located.

The flexible printed circuit board FPCB electrically connects a controller 90 and the pad portion 40 to each other. A signal or power transmitted from the controller 90 moves via connection wires 21, 31, 51, 61, and 71 connected to the pad portion 40.

The controller 90 may receive a vertical synchronization signal, a horizontal synchronization signal, and a clock signal, and may generate a control signal for controlling driving of the first and second scan drive circuits 20 and 30. The generated signal may be transmitted to each of the first and second scan drive circuits 20 and 30 via the pad 44 connected to the flexible printed circuit board FPCB and the connection wires 21 and 31. A scan signal of the first and second scan drive circuits 20 and 30 may be provided to each pixel P via the scan line SL. In addition, the controller 90 provides the driving voltage ELVDD and common voltage ELVSS to the driving power supply wire 60 and the common power supply wire 70, respectively, via the pads 42 and 45 connected to the flexible printed circuit board FPCB and the connection wires 61 and 71. The driving voltage ELVDD may be provided to each pixel P via the driving voltage line PL, and the common voltage ELVSS may be provided to a common electrode of the pixel P.

A data drive circuit 50 may be on the flexible printed circuit board FPCB. The data drive circuit 50 provides a data signal to each pixel P. The data signal of the data drive circuit 50 is provided to each pixel P via the connection wire 51 connected to the pad 41 and the data line DL connected to the connection wire 51. Although FIG. 1 illustrates the data drive circuit 50 on the flexible printed circuit board FPCB, the inventive concepts are not limited thereto. In some exemplary embodiments, the data drive circuit 50 may be on the peripheral area PA of the substrate 100, or otherwise coupled to the substrate 100 or another structure.

The driving power supply wire 60 may be on the peripheral area PA. For example, the driving power supply wire 60 may be between one side of the display unit 10 adjacent to the pad portion 40 and the pad portion 40. The driving voltage ELVDD provided via the connection wire 61 connected to the pad 41 may be provided to each pixel P via the driving voltage line PL.

The common power supply wire 70 may be on the peripheral area PA and may partially surround the display unit 10. For example, the common power supply wire 70 may be in the form of a loop in which one side of the display unit 10 adjacent to the pad portion 40 is open, and may extend along edges of the substrate 100 minus the edge on which the pad portion 40 is arranged.

The common power supply wire 70 is electrically connected to the connection wire 71 connected to the pad 45, and provides the common voltage ELVSS to a common electrode (e.g., a cathode) of an organic light-emitting diode of the pixel P. The connection wire 71 of FIG. 1 is in the form of a loop having one side open, which partially surrounds the display unit 10, and partially overlaps the common power supply wire 70. The connection wire 71 and the common power supply wire 70 may be connected to each other via a contact hole CNT in an insulating layer therebetween, for example, an inorganic insulating layer, and a connection area of the connection wire 71 and the common power supply wire 70, that is, the contact hole CNT, may be an area adjacent to one side of the display unit 10 facing the pad portion 40.

Although not illustrated in FIG. 1, an encapsulation portion externally encapsulating the display unit 10 may be further provided. In some exemplary embodiments, when the display apparatus 1 is rigid, a sealing portion surrounding a perimeter of a display using the encapsulation portion, an encapsulation substrate connected to a substrate via the sealing portion, and the like, may be further provided. In other exemplary embodiments, when the display apparatus 1 is flexible, a thin film encapsulation portion covering the entire display using the encapsulation portion may be further provided.

Figure 3:
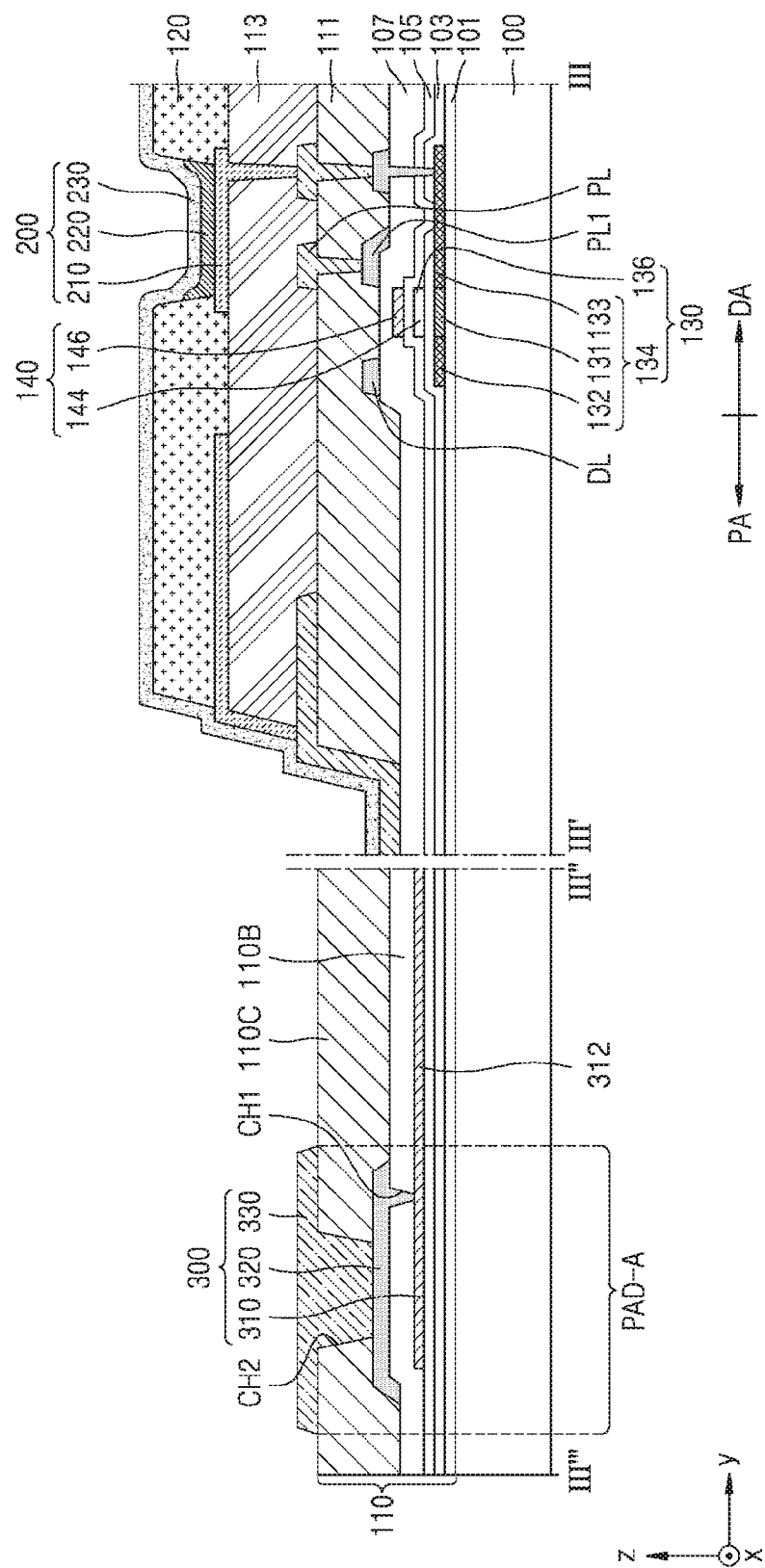
FIG. 3 is a schematic cross-sectional view of a display apparatus according to some exemplary embodiments.

FIG. 3 is a schematic cross-sectional view of a display apparatus according to some exemplary embodiments. That is, FIG. 3 illustrates a schematic cross-sectional view taken along sectional lines III-III' and III"-III'" of FIG. 1.

Referring to FIG. 3, the display apparatus includes the display area DA and the peripheral area PA. The substrate 100 may include various materials, such as at least one of glass, metal, or plastic, such as at least one of polyethylene terephthalate (PET), polyethylene naphthalate (PEN), polycarbonate (PC), polyarylate (PAR), polyetherimide (PEI), polyethersulphone (PES), polyimide (PI), etc.

Referring to the display area DA of FIG. 3, a buffer layer 101 may be on the substrate 100. The buffer layer 101 may prevent (or at least reduce) a foreign material or moisture from permeating through the substrate 100. For example, the buffer layer 101 may include an inorganic material, such as silicon oxide (SiOx), silicon nitride (SiNx), and/or silicon oxynitride (SiON), and may be a single layer or a multilayer.

A thin film transistor 130 and a storage capacitor 140 provided at a location corresponding to the display area DA, and an organic light-emitting diode, which is a display device 200, electrically connected thereto, may be on the substrate 100. The thin film transistor 130 of FIG. 3 may correspond to one of the thin film transistors included in the pixel circuit PC described with reference to FIG. 2, e.g., the driving thin film transistor Td. The storage capacitor 140 of FIG. 3 corresponds to the storage capacitor Cst described with reference to FIG. 2.

The thin film transistor 130 includes a semiconductor layer 134 and a gate electrode 136. The semiconductor layer 134 may include, for example, polysilicon. The semiconductor layer 134 may include a channel region 131 overlapping the gate electrode 136, and a source region 132 and a drain region 133 on sides of the channel region 131. The source region 132 and the drain region 133 include impurities having a higher concentration than those of the channel region 131. In this regard, the impurities may include N-type impurities or P-type impurities. The source region 132 and the drain region 133 may be understood as a source electrode and a drain electrode of the thin film transistor 130.

Although a case in which the semiconductor layer 134 includes polysilicon has been described, the inventive concepts are not limited thereto. In some embodiments, the semiconductor layer 134 may include amorphous silicon or may include an organic semiconductor material.

A gate insulating layer 103 may be between the semiconductor layer 134 and the gate electrode 136. The gate insulating layer 103 may be an inorganic insulating layer including, for example, silicon oxynitride (SiON), silicon oxide (SiOx), and/or silicon nitride (SiNx), and the inorganic insulating layer may be a single layer or a multilayer.

The storage capacitor 140 includes first and second storage capacitor plates 144 and 146 overlapping each other. A first interlayer insulating layer 105 may be between the first and second storage capacitor plates 144 and 146. The first interlayer insulating layer 105, which is a layer having a determined dielectric constant, may be an inorganic insulating layer, such as a layer including silicon oxynitride (SiON), silicon oxide (SiOx), and/or silicon nitride (SiNx), and may be a single layer or a multilayer. Although FIG. 3 illustrates the storage capacitor 140 overlapping the thin film transistor 130, and the first storage capacitor plate 144 being the same as the gate electrode 136 of the thin film transistor 130, the inventive concepts are not limited thereto. In some exemplary embodiments, the storage capacitor 140 may not overlap the thin film transistor 130, and the first storage capacitor plate 144 may be an independent element separate from the gate electrode 136 of the thin film transistor 130.

The storage capacitor 140 may be covered by a second interlayer insulating layer 107. The second interlayer insulating layer 107 may be an inorganic insulating layer, such as a layer including silicon oxynitride (SiON), silicon oxide (SiOx), and/or silicon nitride (SiNx), and may be a single layer or a multilayer.

The driving voltage line PL may be on a third interlayer insulating layer 111. The driving voltage line PL may include a metal, such as aluminum (Al), copper (Cu), titanium (Ti), etc., and may be a multilayer or a single layer. In some exemplary embodiments, the driving voltage line PL may have a multilayer structure of Ti/Al/Ti.

FIG. 3 illustrates a lower driving voltage line PL1 further included as part of the display apparatus, the lower driving voltage line PL1 being under the third interlayer insulating layer 111. The lower driving voltage line PL1 may be electrically connected to the driving voltage line PL via a contact hole penetrating the third interlayer insulating layer 111, and thus, may prevent (or at least reduce) a voltage drop of the driving voltage ELVDD provided via the driving voltage line PL. The lower driving voltage line PL1 may include the same material as that of the data line DL. For example, the lower driving voltage line PL1 and the data line DL may include a metal, such as aluminum (Al), copper (Cu), titanium (Ti), etc., and may be a multilayer or a single layer. In some exemplary embodiments, the lower driving voltage line PL1 and the data line DL may have a multilayer structure, such as Ti/Al/Ti or TiN/Al/Ti.

The third interlayer insulating layer 111 may include, for example, an organic insulation material. The organic insulation material may include at least one of an imide-based polymer, a general-purpose polymer, such as poly(methyl methacrylate) (PMMA) or polystyrene (PS), a polymer derivative having a phenol group, an acryl-based polymer, an aryl ether-based polymer, an amide-based polymer, a fluorine-based polymer, a p-xylene based polymer, a vinyl alcohol-based polymer, and a blend thereof. In some exemplary embodiments, the third interlayer insulating layer 111 may include polyimide. In some exemplary embodiments, the third interlayer insulating layer 111 may include an inorganic insulation material, such as a layer including silicon oxynitride (SiON), silicon oxide (SiOx), and/or silicon nitride (SiNx).

The driving voltage line PL may be covered by an organic insulating layer 113, and the organic insulating layer 113 may include at least one of an imide-based polymer, a general-purpose polymer, such as PMMA or PS, a polymer derivative having a phenol group, an acryl-based polymer, an aryl ether-based polymer, an amide-based polymer, a fluorine-based polymer, a p-xylene based polymer, a vinyl alcohol-based polymer, and a blend thereof. In some exemplary embodiments, the organic insulating layer 113 may include polyimide.

A pixel electrode 210 is on the organic insulating layer 113. A pixel-defining layer 120 is on the pixel electrode 210, and the pixel-defining layer 120 may have an opening corresponding to each pixel or sub-pixel, that is, an opening exposing at least a central portion of the pixel electrode 210, and thus, may define a pixel. In addition, the pixel-defining layer 120 may increase a distance between an edge of the pixel electrode 210 and a common electrode 230, and thus, may prevent an arc, etc., therebetween. The pixel-defining layer 120 may include an organic material, for example, polyimide, hexamethyldisiloxane (HMDSO), etc.

An intermediate layer 220 may include a low molecular material or a polymer material. When the intermediate layer 220 includes a low molecular material, the intermediate layer 220 may have a structure in which a hole injection layer (HIL), a hole transport layer (HTL), an emission layer (EML), an electron transport layer (ETL), an electron injection layer (EIL), etc., are stacked in a single or complex structure, and may include various organic materials including, for instance, copper phthalocyanine (CuPc), N,N'-Di (naphthalene-1-yl)-N,N'-diphenyl-benzidine (NPB), tris-8-hydroxyquinoline aluminum (Alq3), etc. Such layers may be formed by vacuum deposition; however, any other suitable technique may be utilized.

When the intermediate layer 220 includes a polymer material, the intermediate layer 220 may generally have a structure including an HTL and an EML. In this regard, the HTL may include PEDOT, and the EML may include a polymer material, such as a poly-phenylenevinylene (PPV)-based material, a polyfluorene-based material, etc. A structure of the intermediate layer 220 is not limited thereto, and may have various structures. For example, at least one of the layers constituting the intermediate layer 220 may be integrally formed over a plurality of pixel electrodes 210. Alternatively, the intermediate layer 220 may include a layer patterned to correspond to each of a plurality of pixel electrodes 210.

The common electrode 230 may be on the display area DA and may cover the display area DA. That is, the common electrode 230 may be integrally formed to cover a plurality of pixels.

Referring to the peripheral area PA of FIG. 3, a drive circuit (not shown), for example, the first scan drive circuit 20, is on the substrate 100. The first scan drive circuit 20 may include thin film transistors TFT-P (not shown), and may include a wire (not shown) connected to the thin film transistors TFT-P. The thin film transistors TFT-P may be formed by the same process as that used to form the thin film transistor TFT of the pixel circuit PC. The first scan drive circuit 20 includes an insulating layer between elements constituting the thin film transistors TFT-P (e.g., a semiconductor layer, a gate electrode, etc.). For example, at least one of the buffer layer 101, the gate insulating layer 103, and the first and second interlayer insulating layers 105 and 107 may extend to the peripheral area PA and constitute an insulating layer 110. The insulating layer 110 includes an inorganic insulation material.

A pad area PAD-A may be located at one side of the peripheral area PA surrounding the display unit 10, and a pad portion 300 is on the pad area PAD-A. The pad portion 300 may directly contact a terminal of the flexible printed circuit board FPCB of FIG. 1 to transmit a signal or power transmitted from the controller 90 to the pixel P. In some exemplary embodiments, the pad portion 300 of FIG. 3 may transmit a data signal of the data drive circuit 50 to each pixel P. The data signal of the data drive circuit 50 may be provided to each pixel P via a connection wire 312 connected to the pad portion 300 and the data line DL connected to the connection wire 312; however, the inventive concepts are not limited thereto. For instance, the pad portion 300 of FIG. 3 may be one of pad portions 40 of FIG. 1, and the connection wire 312 may be one of the connection wires 21, 31, 51, 61, and 71 of FIG. 1.

Figure 4:
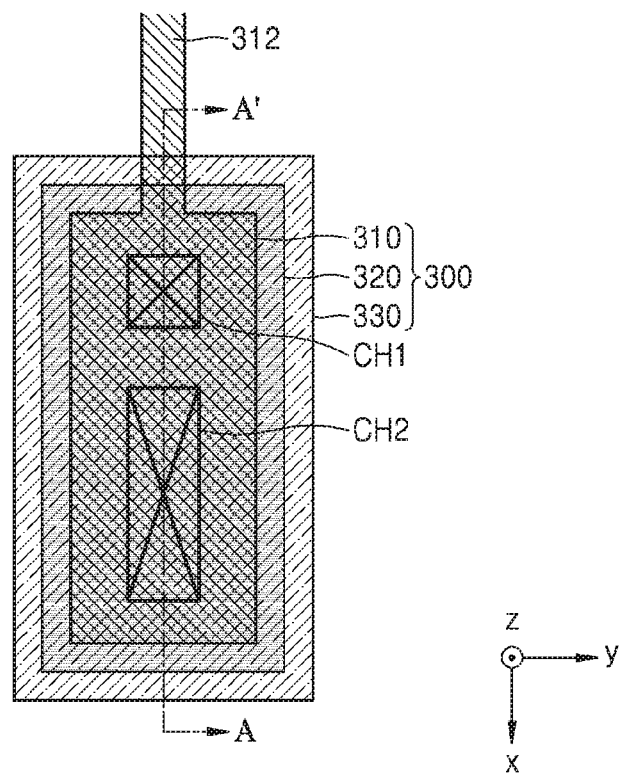
FIG. 4 is a schematic plan view of a portion of a display apparatus according to some exemplary embodiments.

The pad portion 300 of FIG. 3 may include a first conductive layer 310, a second conductive layer 320 on the first conductive layer 310, and a third conductive layer 330 on the second conductive layer 320. The first conductive layer 310, the second conductive layer 320, and the third conductive layer 330 may be electrically connected to one another. For instance, the first conductive layer 310 and the second conductive layer 320 may contact each other, and the second conductive layer 320 and the third conductive layer 330 may contact each other. The first conductive layer 310 may be connected to the connection wire 312, and the first conductive layer 310 and the connection wire 312 may be integrally formed with each other. That is, the first conductive layer 310 may be defined as a partial area including an end portion of the connection wire 312. Referring to FIG. 4, in some cases, a width of a direction (e.g., Y-axis direction) of the first conductive layer 310 may be greater than that of the same direction (e.g., Y-axis direction) of the connection wire 312.

The first conductive layer 310, the second conductive layer 320, and the third conductive layer 330 may include the same material as that of an electrode and/or wires constituting a pixel circuit of the display area DA. Referring to the display area DA of FIG. 3, the pixel circuit may include the semiconductor layer 134, the first gate electrode 136 (i.e., the first storage capacitor plate 144) at least partially overlapping the semiconductor layer 134, and a second gate electrode (i.e., the second storage capacitor plate 146), and may include a first wiring layer DL (i.e., the data line DL) above (but not necessarily overlapping) the second gate electrode (i.e., the second storage capacitor plate 146), and a second wiring layer PL (i.e., the driving voltage line PL) above (but not necessarily overlapping) the first wiring layer DL (i.e., the data line DL).

In some exemplary embodiments, the first conductive layer 310 may include the same material as that of the second gate electrode (i.e., the second storage capacitor plate 146), and the second conductive layer 320 may include the same material as that of the first wiring layer DL. A first insulating layer 110B may be between the first conductive layer 310 and the second conductive layer 320, and the first conductive layer 310 and the second conductive layer 320, which may contact each other via a first contact hole CH1 in the first insulating layer 110B, and thus, may be electrically connected to each other. The first insulating layer 110B may be provided, for example, by extending the second interlayer insulating layer 107 of the display area DA into the peripheral area PA.

In some exemplary embodiments, the second conductive layer 320 may include the same material as that of the first wiring layer DL, and the third conductive layer 330 may include the same material as that of the second wiring layer PL. A second insulating layer 110C may be between the second conductive layer 320 and the third conductive layer 330, and the second conductive layer 320 and the third conductive layer 330 may contact each other via a second contact hole CH2 in the second insulating layer 110C, and thus, may be electrically connected to each other. The second insulating layer 110C may be provided, for example, by extending the third interlayer insulating layer 111 of the display area DA into the peripheral area PA.

As illustrated in FIG. 3, the third conductive layer 330 may be exposed to the outside without being completely covered by an upper insulating layer, for example, the organic insulating layer 113. The third conductive layer 330 may contact a terminal of the flexible printed circuit board FPCB of FIG. 1.

In a conventional display apparatus, as resolution increases, thicknesses of layers on the substrate 100 gradually decrease. As a comparative example, when the pad portion 300 includes a pad electrode exposed to the outside, and the connection wire 312 connected to the pad electrode and extending to the display unit 10, an insulating layer between the pad electrode and the connection wire 312 is very thin. As described above, when the insulating layer is not thick enough, the insulating layer located in the pad area PAD-A may be cracked due to pressure during bonding of the flexible printed circuit board FPCB. A crack in the insulating layer can be transferred to the pad electrode and/or the connection wire 312 and may cause defects, such as a short circuit and/or a connection failure.

As another comparative example, a case in which the first conductive layer 310 and the third conductive layer 330 directly contact each other may be considered. However, in this case, a multilayered insulating layer, for example, an inorganic insulating layer, is interposed between the first conductive layer 310 and the third conductive layer 330, and a contact portion between the first conductive layer 310 and the third conductive layer 330 has a step due to the multi-layered insulating layer. The step between the first conductive layer 310 and the third conductive layer 330 may cause a short-circuit failure, etc., in the pad portion 300.

Thus, in a display apparatus according to various exemplary embodiments, the pad portion 300 may include the second conductive layer 320 as a bridge between the third conductive layer 330 exposed to the outside and the first conductive layer 310 extending from the connection wire 312. The pad portion 300 may include a triple conductive layer, and two or more insulating layers may be interposed between the first to third conductive layers 310 to 330. Due to the two or more insulating layers, the pad area PAD-A may be sufficiently thick insulating layers, thereby preventing a crack in the pad area PAD-A resulting from pressure during bonding of the flexible printed circuit board FPCB. Thus, issues with the pad portion 300 in the pad area PAD-A, such as a short circuit and a connection failure, may also be effectively addressed.

Figure 5:
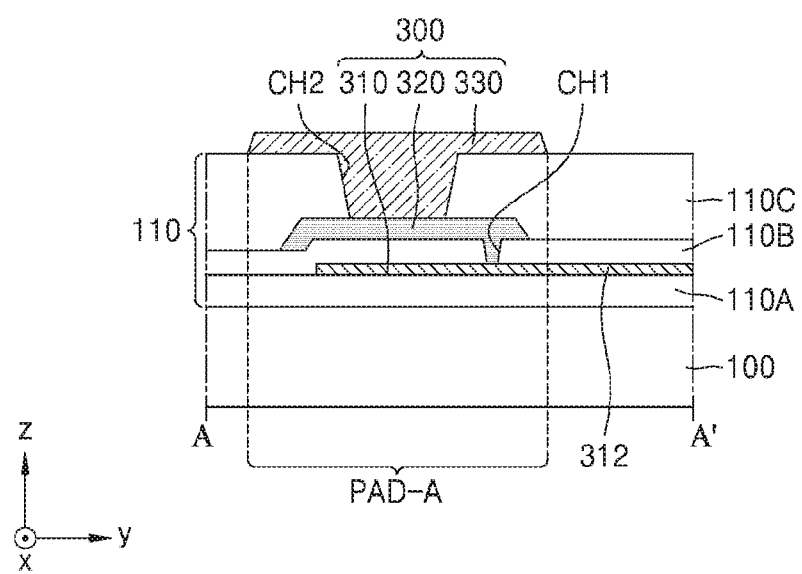
FIG. 5 is a schematic cross-sectional view of a portion of a display apparatus according to some exemplary embodiments.

FIG. 4 is a schematic plan view of a portion of a display apparatus according to some exemplary embodiments. FIG. 5 is a schematic cross-sectional view of a portion of a display apparatus according to some exemplary embodiments.

Referring to FIGS. 4 and 5, the pad portion 300 includes the first conductive layer 310 on the substrate 100, the second conductive layer 320 on the first conductive layer 310, and the third conductive layer 330 on the second conductive layer 320. In FIG. 5, insulating layers 110 may be arranged on the substrate 100, and the insulating layers 110 may include a lower film 110A, the first insulating layer 110B, and the second insulating layer 110C. Although the lower film 110A, the first insulating layer 110B, and the second insulating layer 110C are illustrated as single layers, each may be a single layer or a multilayer. The insulating layers 110 of FIG. 5 may be the same as insulating layers 110 of FIG. 3.

As illustrated in FIG. 5, the first conductive layer 310 may be on the same layer as the connection wire 312, and may include the same material as that of the connection wire 312. The first conductive layer 310 and the connection wire 312 may be integrally formed with each other, and a partial area including an end portion of the connection wire 312 may be defined as the first conductive layer 310. In some cases, as illustrated in FIG. 4, a width of a direction (e.g., Y-axis direction) of the first conductive layer 310 may be greater than that of the same direction (e.g., Y-axis direction) of the connection wire 312. Referring also to FIG. 3, in some exemplary embodiments, when the first conductive layer 310 includes the same material as that of the first gate electrode 136, the lower film 110A may be the buffer layer 101 and the gate insulating layer 103. In some exemplary embodiments, when the first conductive layer 310 includes the same material as that of the second gate electrode, the lower film 110A may be the buffer layer 101, the gate insulating layer 103, and the first interlayer insulating layer 105.

The second conductive layer 320 may be on the first conductive layer 310, and may be electrically connected to the first conductive layer 310 via the first contact hole CH1 in the first insulating layer 110B. Referring also to FIG. 3, in some exemplary embodiments, when the second conductive layer 320 includes the same material as that of the second gate electrode, the first insulating layer 110B may be the first interlayer insulating layer 105. In some exemplary embodiments, when the second conductive layer 320 includes the same material as that of the first wiring layer DL, the first insulating layer 110B may be the second interlayer insulating layer 107.

The third conductive layer 330 may be on the second conductive layer 320, and may be electrically connected to the second conductive layer 320 via the second contact hole CH2 in the second insulating layer 110C. Referring also to FIG. 3, in some exemplary embodiments, when the third conductive layer 330 includes the same material as that of the first wiring layer DL, the second insulating layer 110C may be the second interlayer insulating layer 107. In some exemplary embodiments, when the third conductive layer 330 includes the same material as that of the second wiring layer PL, the second insulating layer 110C may be the third interlayer insulating layer 111.

Although FIG. 4 illustrates the first contact hole CH1 and the second contact hole CH2 not overlapping each other on a plane, the inventive concepts are not limited thereto.

On the plane, an area of the first contact hole CH1 may be about 10% to about 30% of that of the third conductive layer 330 forming a pad electrode exposed to the outside, e.g., may be about 20%. In addition, on the plane, an area of the second contact hole CH2 may be about 70% to about 90% of that of the third conductive layer 330, e.g., may be about 80%. On the plane, the area of the first contact hole CH1 may be about ¼ of the area of the second contact hole CH2. As a comparative example, regarding a pad electrode directly contacting the flexible printed circuit board FPCB, when the third conductive layer 330 and the second insulating layer 110C connected thereto contact by as much as about 70% or less, and more particularly, about 80% or less, resistance characteristics of integrated circuit (IC) contacts are difficult to obtain.

Accordingly, in the display apparatus according to various exemplary embodiments, on the plane, the area of the first contact hole CH1 may be about 20% of the area of the third conductive layer 330 and the area of the second contact hole CH2 may be about 80% of the area of the remaining third conductive layer 330, and thus, resistance characteristics of IC contacts may be obtained.

Figure 6:
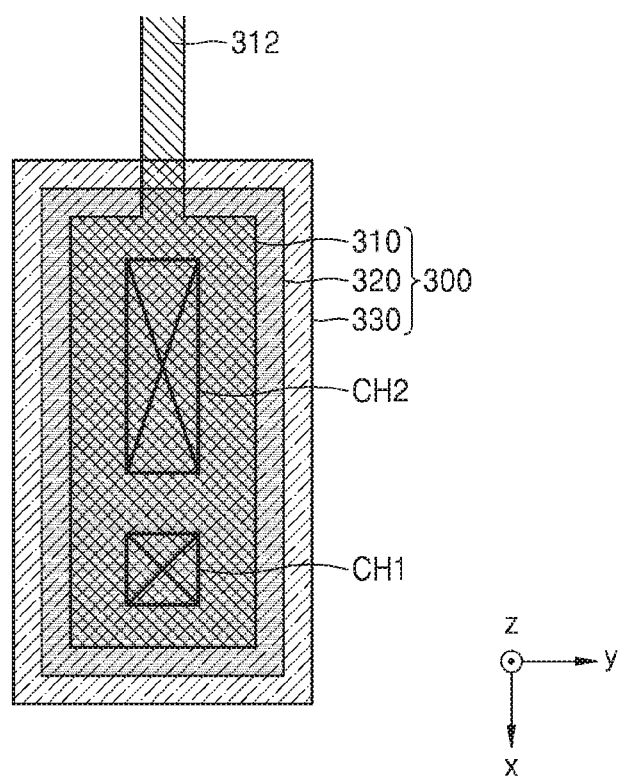
FIG. 6 is a schematic plan view of a portion of a display apparatus according to some exemplary embodiments.
Figure 7:
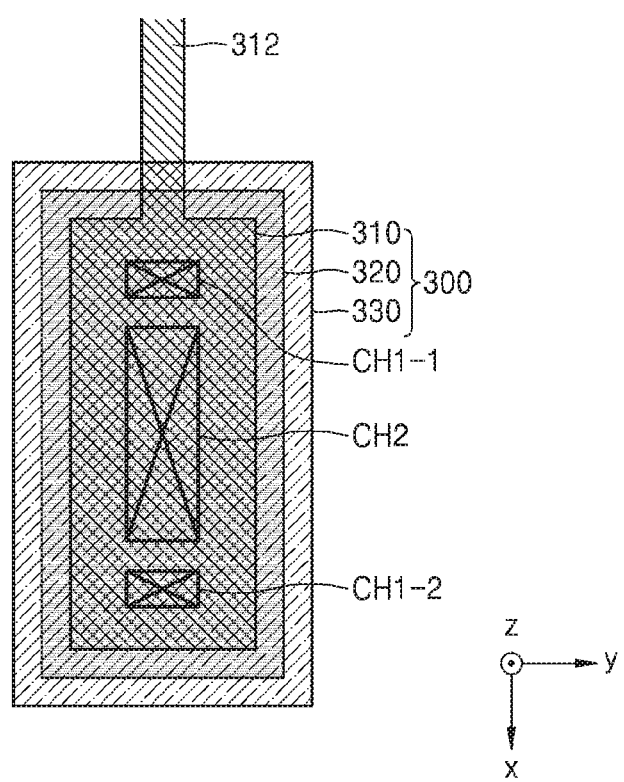
FIG. 7 is a schematic plan view of a portion of a display apparatus according to some exemplary embodiments.
Figure 8:
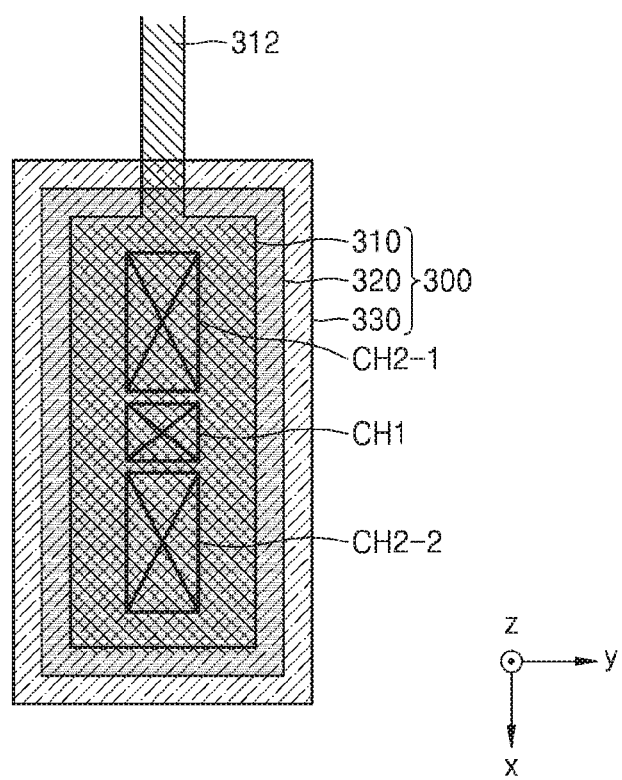
FIG. 8 is a schematic plan view of a portion of a display apparatus according to some exemplary embodiments.

FIG. 6 is a schematic plan view of a portion of a display apparatus according to some exemplary embodiments. FIG. 7 is a schematic plan view of a portion of a display apparatus according to some exemplary embodiments. FIG. 8 is a schematic plan view of a portion of a display apparatus according to some exemplary embodiments.

The various exemplary embodiments of FIGS. 6 to 8 are different from the previous exemplary embodiments in terms of a structure of the first contact hole CH1 and the second contact hole CH2. Hereinafter, differences will be mainly explained, and the other same elements will be understood by referring to FIGS. 1 to 3 and 5 described above.

Referring to FIG. 6, the second contact hole CH2 may be provided at a side adjacent to the connection wire 312, and the first contact hole CH1 may be provided at a side relatively farther from the connection wire 312. Although FIG. 6 illustrates the first contact hole CH1 and the second contact hole CH2 not overlapping each other, the first contact hole CH1 and the second contact hole CH2 may be formed on different layers to overlap or at least partially overlap each other on the plane.

Referring to FIG. 7, the first contact hole CH1 may include a 1-1 contact hole CH1-1 and a 1-2 contact hole CH1-2. That is, the first conductive layer 310 and the second conductive layer 320 may contact each other via the 1-1 contact hole CH1-1 and the 1-2 contact hole CH1-2. The third conductive layer 330 may contact the second conductive layer 320 via the second contact hole CH2, and on the plane, the second contact hole CH2 may be between the 1-1 contact hole CH1-1 and the 1-2 contact hole CH1-2. Even in this case, on the plane, a sum of areas of the 1-1 contact hole CH1-1 and the 1-2 contact hole CH1-2 may be about 20% of an area of the third conductive layer 330, and an area of the second contact hole CH2 may be about 80% of that of the third conductive layer 330.

Referring to FIG. 8, the second contact hole CH2 may include a 2-1 contact hole CH2-1 and a 2-2 contact hole CH2-2. That is, the second conductive layer 320 and the third conductive layer 330 may contact each other via the 2-1 contact hole CH2-1 and the 2-2 contact hole CH2-2. The first conductive layer 310 may contact the second conductive layer 320 via the first contact hole CH1, and on the plane, the first contact hole CH1 may be between the 2-1 contact hole CH2-1 and the 2-2 contact hole CH2-2. Even in this case, on the plane, a sum of areas of the 2-1 contact hole CH2-1 and the 2-2 contact hole CH2-2 may be about 80% of an area of the third conductive layer 330, and an area of the first contact hole CH1 may be about 20% of that of the third conductive layer 330.

According to one or more exemplary embodiments, a display apparatus in which a pad connection portion has improved reliability may be implemented.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display apparatus comprising:
a substrate;
a display unit on the substrate, the display unit comprising a pixel circuit and a display device electrically connected to the pixel circuit;
a pad portion at one side of a peripheral area outside the display unit, the pad portion comprising:
a first conductive layer;
a first insulating layer arranged on the first conductive layer, the first insulating layer comprising a first contact hole;
a second conductive layer arranged on and electrically connected to the first conductive layer via the first contact hole; a second insulating layer arranged on the second conductive layer, the second insulating layer comprising a second contact hole; and
a third conductive layer arranged on and electrically connected to the second conductive layer via the second contact hole; and
a connection wire connecting the pad portion and the display unit to each other to transmit a signal input from the pad portion to the display device, the connection wire comprising a same material as that of the first conductive layer, wherein the pixel circuit comprises:
a thin film transistor comprising:
a semiconductor layer; and
a first gate electrode at least partially overlapping the semiconductor layer;
a first wiring layer, the first gate electrode being between the first wiring layer and the substrate; and
a second wiring layer, the first wiring layer being between the second wiring layer and the first gate electrode.

2. The display apparatus of claim 1, wherein the connection wire is configured to transmit a data signal input from the pad portion to the display device.

3. The display apparatus of claim 1, wherein the first conductive layer comprises a same material as that of the first gate electrode.

4. The display apparatus of claim 1, wherein the second conductive layer comprises a same material as that of the first wiring layer.

5. The display apparatus of claim 1, wherein the third conductive layer comprises a same material as that of the second wiring layer.

6. The display apparatus of claim 1, wherein the first conductive layer and the second conductive layer are in contact with one another via the first contact hole.

7. The display apparatus of claim 6, wherein, on a plane, an area of the first contact hole is 10% to 30% of that of the third conductive layer.

8. The display apparatus of claim 6, wherein the second conductive layer and the third conductive layer are in contact with one another via the second contact hole.

9. The display apparatus of claim 8, wherein, on a plane, an area of the second contact hole is 70% to 90% of that of the third conductive layer.

10. The display apparatus of claim 8, wherein, on a plane, an area of the first contact hole is one fourth of that of the second contact hole.

11. The display apparatus of claim 1, wherein:
the pixel circuit further comprises a second gate electrode between the first gate electrode and the first wiring layer; and
the first conductive layer comprises a same material as that of the second gate electrode.

12. The display apparatus of claim 1, further comprising:
a printed circuit board electrically connected to the pad portion.

13. A display apparatus comprising:
a substrate comprising a display area and a peripheral area outside the display area;
a display unit on the display area of the substrate, the display unit comprising a pixel circuit and a display device electrically connected to the pixel circuit, the pixel circuit comprising:
a thin film transistor comprising a semiconductor layer, a gate electrode, and a gate insulating layer between the semiconductor layer and the gate electrode;
a first wiring layer, the gate electrode being between the first wiring layer and the substrate; and
a second wiring layer, the first wiring layer being between the second wiring layer and the gate electrode;
a connection wire electrically connected to the pixel circuit and extending towards the peripheral area; and
a pad portion at one side of the peripheral area of the substrate, the pad portion being configured to transmit a signal to the display device via the connection wire, the pad portion comprising:
a first conductive layer comprising a same material as that of the gate electrode, the gate insulating layer being stacked between the first conductive layer and the substrate;

a second conductive layer at least partially overlapping the first conductive layer, the second conductive layer comprising a same material as that of the first wiring layer;

a third conductive layer exposed to the outside and at least partially overlapping the second conductive layer, the third conductive layer comprising a same material as that of the second wiring layer;

a first insulating layer between the first conductive layer and the second conductive layer, the first insulating layer comprising at least one first contact hole, the first conductive layer and the second conductive layer being in contact with one another via the first contact hole; and a second insulating layer between the second conductive layer and the third conductive layer, the second insulating layer comprising at least one second contact hole, the second conductive layer and the third conductive layer being in contact with one another via the second contact hole.

14. The display apparatus of claim 13, wherein the connection wire comprises a same material as that of the gate electrode.

15. The display apparatus of claim 13, wherein the first contact hole and the second contact hole do not overlap each other on a plane.

16. The display apparatus of claim 13, wherein, on a plane, an area of the first contact hole is one fourth of that of the second contact hole.

17. The display apparatus of claim 13, wherein the connection wire is configured to transmit a data signal input from the pad portion to the display device.

18. The display apparatus of claim 13, further comprising:
a printed circuit board contacting the third conductive layer and electrically connected to the pad portion.

* * * * *